US010066127B2

(12) United States Patent
Yu et al.

(10) Patent No.: US 10,066,127 B2
(45) Date of Patent: Sep. 4, 2018

(54) COMPOSITION FOR CHEMICAL MECHANICAL POLISHING AND METHOD FOR REDUCING CHEMICAL MECHANICAL POLISHING SURFACE DEFECTS

(71) Applicant: TAIWAN SEMICONDUCTOR MANUFACTURING COMPANY LTD., Hsinchu (TW)

(72) Inventors: An-Dih Yu, New Taipei (TW); Chi-Ming Yang, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/210,058

(22) Filed: Jul. 14, 2016

(65) Prior Publication Data

US 2018/0016467 A1  Jan. 18, 2018

(51) Int. Cl.
| | | |
|---|---|---|
| *H01L 21/302* | (2006.01) |
| *H01L 21/461* | (2006.01) |
| *B44C 1/22* | (2006.01) |
| *C23F 1/00* | (2006.01) |
| *C03C 15/00* | (2006.01) |
| *C03C 25/68* | (2006.01) |
| *C09G 1/02* | (2006.01) |
| *H01L 21/321* | (2006.01) |
| *H01L 21/768* | (2006.01) |
| *C09G 1/00* | (2006.01) |
| *C09K 3/14* | (2006.01) |

(52) U.S. Cl.
CPC ............... *C09G 1/02* (2013.01); *C09G 1/00* (2013.01); *C09K 3/14* (2013.01); *H01L 21/3212* (2013.01); *H01L 21/7684* (2013.01)

(58) Field of Classification Search
None
See application file for complete search history.

(56) References Cited

U.S. PATENT DOCUMENTS 5,704,987 A * 1/1998 Huynh ............... B08B 1/04
 134/26
2003/0228763 A1* 12/2003 Schroeder ......... H01L 21/3212
 438/691

OTHER PUBLICATIONS

Liang Jiang et al., 1 2, 4-Triazole as a corrosion inhibitor in copper chemical mechanical polishing, Liang Jiang et al., Thin Solid Films 556 (2014) 395-404.

* cited by examiner

*Primary Examiner* — Stephanie P Duclair
(74) *Attorney, Agent, or Firm* — WPAT, P.C., Intellectual Property Attorneys; Anthony King

(57) ABSTRACT

The present disclosure provides chemical mechanical polishing (CMP) slurry, including an abrasive, a chelator, an oxidizing agent, and a surface modificator. The surface modificator is configured to modify a surface from hydrophobic to hydrophilic. The present disclosure also provides a method for reducing chemical mechanical polishing (CMP) surface defects. The method includes adding an additive into CMP slurry by at least 0.0001 wt %, wherein the additive modifies a surface to be polished from hydrophobic to hydrophilic.

20 Claims, 8 Drawing Sheets

COMPOSITION FOR CHEMICAL MECHANICAL POLISHING AND METHOD FOR REDUCING CHEMICAL MECHANICAL POLISHING SURFACE DEFECTS

BACKGROUND

Integrated circuits are made up of millions of active devices formed in or on a silicon substrate. The active devices, which are initially isolated from one another, are united to form functional circuits and components. The devices are interconnected through the use of well-known multilevel interconnections. Interconnection structures normally have a first layer of metallization, an interconnection layer, a second level of metallization, and sometimes a third and subsequent levels of metallization. Interlevel dielectrics such as doped and undoped silicon dioxide ($SiO_2$), are used to electrically isolate the different levels of metallization in a silicon substrate or well.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as slurry is provided to the wafer/pad interface. Polishing is continued in this manner until the desired film on the insulator is removed.

The slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride and the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
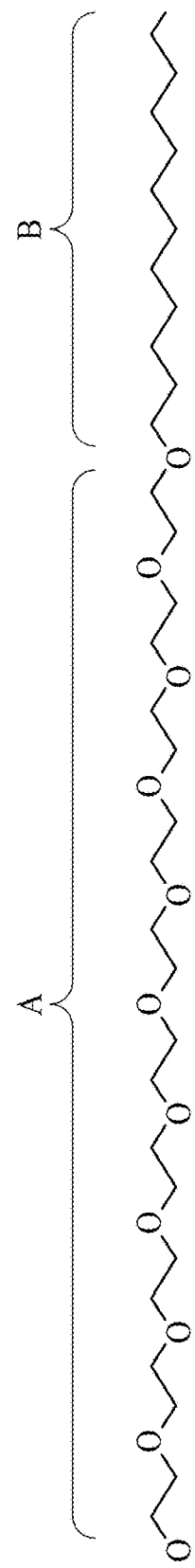
FIG. 1A is a chemical formula for one slurry additive in a CMP slurry, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The present invention relates to a chemical mechanical polishing composition that comprises at least one oxidizer and at least one catalyst that promotes a chemical reaction between the oxidizer and a substrate metal layer. The chemical mechanical polishing composition is used to polish at least one metal layer associated with a substrate selected from the group including silicon substrates, TFT-LCD glass substrates, GaAs substrates, and other substrates associated with integrated circuits, thin films, multiple level semiconductors, and wafers. In particular, the chemical mechanical polishing slurry of this invention has been found to exhibit excellent polishing performance when used to polish a substrate including one or more layers of metals, for example, copper and aluminum, in a single step, multiple metal layer chemical mechanical polishing process.

Before describing the details of the various preferred embodiments of this invention, some of the terms that are used herein will be defined. The "chemical mechanical composition" refers to the combination of at least one oxidizer and at least one catalyst that may be used in conjunction with an abrasive pad to remove one or more layers of metal from a multiple layer metallization.

The term chemical mechanical polishing slurry, ("CMP slurry"), refers to another useful product of this invention that comprises the chemical mechanical composition of this disclosure and at least one abrasive. The CMP slurry is useful for polishing a multiple level metallization which may include but are not limited to semi-conductor thin-films, integrated circuit thin-films, and for polishing any other films, surfaces and substrates where CMP processes are useful.

Key performance indicators for metal CMP slurry include degree of dishing, degree of erosion, and removal rate. Dishing usually happens at a larger opening area such as a large metal pad where more materials are removed from the center of the large metal pad than from the edge of the large metal pad. Difference between the edge of the metal pad (or the dielectric surrounding the metal pad) and the center of the metal pad is measured. Erosion measures a difference between two dielectric height levels in which one is away from a dense metal pattern and the other being in a middle of the dense metal pattern. Serious erosion after unsatisfactory CMP may cause open loop between different layers in next dual damascene interconnection. Removal rate relates to the through-put of CMP operation. Higher removal rate leads to greater device through-put.

In the present disclosure, an additive to metal CMP slurry is introduced. The addition of such additive in specific amount can reduce degree of dishing and degree of erosion, and increase the removal rate simultaneously. In some embodiments, the CMP slurry includes abrasive, complexing agent (or referred as chelator herein), oxidizing agent, and a surface modificator (or referred as surfactant or additives herein). The polishing compositions of this disclosure may include one or more optional chemical mechanical polishing slurry additives include catalysts, stabilizers, dispersants, surfactants, corrosion inhibitors, buffers, compounds for adjusting solution pH and so forth. Any ingredients that are known in the art to be useful in chemical mechanical polishing slurries and compositions may be incorporated into the slurry of the present disclosure.

In some embodiments, the CMP slurry described herein is for polishing metal surface such as copper, aluminum, copper- or aluminum-containing alloys. The terms "copper" and "copper-containing alloys" are used interchangeably herein as it is within the understanding of one of skill in the art that the terms include, but are not limited to, substrates comprising layers of pure copper, copper aluminum alloys, and Ti/TiN/Cu, and Ta/TaN/Cu multi-layer substrates. Hence, In some embodiments, metal polishing accelerator can be any chemicals that are known in the art to promote metal dissolution during chemical mechanical processes. Examples of metal polishing accelerator include, but are not limited to carboxylic acids, phosphonic acids, thiols, nitriles, phosphates and mixtures thereof Silane compounds that are useful in preparing silane modified polishing agents for enhanced metal polishing include, but are limited to, methacryloxypropyltrialkoxysilane, isocyanatopropyltrialkoxysilane, ureidopropyltrialkoxysilane, mercaptopropyltrialkoxysilane, cyanoethyltrialkoxysilane, isocyanatopropyltrialkoxysilane, 4,5-dihydro-1-(3-trikoxyslylpropyl)imidazole, and mixtures thereof.

The abrasive used in the present CMP slurry is typically a metal oxide. The metal oxide abrasive may be selected from the group including alumina, titania, zirconia, germania, silican ceria and mixtures thereof. The CMP slurry of the present disclosure preferably includes from about 1.0 to about 15.0 weight percent or more of an abrasive. It is more preferred, however, that the CMP slurry of this invention includes from about 2.0 to about 6.0 wt % abrasive. The metal oxide abrasive may be produced by any techniques known to those skilled in the art. Metal oxide abrasives can be produced using any high temperature process such as sol-gel, hydrothermal or plasma process, or by processes for manufacturing fumed or precipitated metal oxides. Preferably, the metal oxide is a fumed or precipitated abrasive and more preferably it is a fumed abrasive such as fumed silica or fumed alumina. For example, the production of fumed metal oxides is a well-known process which involves the hydrolysis of suitable feedstock vapor (such as aluminum chloride for an alumina abrasive) in a flame of hydrogen and oxygen. Molten particles of roughly spherical shapes are formed in the combustion process, the diameters of which are varied through process parameters. These molten spheres of alumina or similar oxide, typically referred to as primary particles, fuse with one another by undergoing collisions at their contact points to form branched, three dimensional chain-like aggregates. The force necessary to break aggregates is considerable. During cooling and collecting, the aggregates undergo further collision that may result in some mechanical entanglement to form agglomerates. Agglomerates are thought to be loosely held together by van der Waals forces and can be reversed, i.e. de-agglomerated, by proper dispersion in a suitable media.

Precipitated abrasives may be manufactured by conventional techniques such as by coagulation of the desired particles from an aqueous medium under the influence of high salt concentrations, acids or other coagulants. The particles are filtered, washed, dried and separated from residues of other reaction products by conventional techniques known to those skilled in the art.

The CMP slurry to polish metals and metal based components including copper, aluminum, and aluminum alloys such as aluminum/copper alloys, and various mixtures and combinations thereof by mechanically polishing the metals to remove the respective oxide layer. The oxidizing agent used in the present CMP slurry may be present in the chemical mechanical polishing slurry of this disclosure in an amount ranging from about 0.3 to about 17.0 wt % and most preferably from about 1.0 to about 12.0 wt %. In some embodiments, a chemical mechanical composition comprising an oxidizing agent and catalyst that is useful in oxidizing metal layers in polishing applications. This chemical mechanical composition is useful when incorporated in a chemical mechanical polishing slurry or when used alone in conjunction with an abrasive pad to polish metals and metal based components including copper, aluminum and various mixtures and combinations thereof.

The chemical mechanical composition of the present disclosure includes at least one oxidizing agent that has an electrochemical potential greater than the electrochemical potential necessary to oxidize the catalyst. For example an oxidizing agent having a potential of greater than 0.771 volts versus normal hydrogen electrode is necessary when a hexa aqua iron catalyst is oxidized from Fe(II) to Fe(III). If an aqua copper complex is used, an oxidizing agent having a potential of greater than 0.153 volts versus normal hydrogen electrode is necessary to oxidize Cu(I) to Cu(II). These potentials are for specific complexes only, and may change, as will the useful oxidizers, upon the addition of additives such as ligands (complexing agents) to the compositions of this invention.

The purpose of the catalyst is to transfer electrons from the metal being oxidized to the oxidizer (or analogously to transfer electrochemical current from the oxidizer to the metal). The catalyst or catalysts chosen may be metallic, non-metallic, or a combination thereof and the catalyst must be able to shuffle electrons efficiently and rapidly between the oxidizer and metal substrate surface. Most preferred metal catalysts are compounds of Ag, Cu and Fe and mixtures thereof Especially preferred are iron catalysts such as but not limited to inorganic salts of iron, such as iron (II or III) nitrate, iron (II or III) sulfate, iron (II or III) halides, including fluorides, chlorides, bromides, and iodides, as well as perchlorates, perbromates and periodates, and ferric organic iron (II or III) compounds such as but not limited to acetates, acetylacetonates, citrates, gluconates, oxalates, phthalates, and succinates, and mixtures thereof.

During chemical mechanical polishing, it is important to inhibit dissolution of the substrate surface layer in order to minimize surface defectively. One class of compounds found to be useful in combination with oxidizing agents to control surface dissolution is complexing agents. Useful complexing agents include, but are not limited to, acids such as glycine, citric, lactic, tartaric, succinic, acetic, malonic oxalic and other acids and salts thereof such as ammonium tartarate, as well as amino acid and amino sulfuric acids and their salts. Preferred complexing agents are glycine, tartaric acid, citric acid, malonic acid, and mixtures thereof with tartaric acid being most preferred. The complexing agents serve to form a complex with the oxidized metal and not the underlying unoxidized metal thereby limiting the depth of the oxidized layer.

In the present disclosure, a CMP composition includes a surfactant having one hydrophobic end and one hydrophilic end opposite to the hydrophobic end. Referring to FIG. 1A, FIG. 1A shows a chemical formula for one slurry additive in a CMP slurry, in accordance with some embodiments of the present disclosure. FIG. 1A shows an ether group with substituent A and substituent B connected by an oxygen.

In some embodiments, substituent A includes a hydrophilic end and substituent B includes a hydrophobic end. Both ends are away from the oxygen. For example, substituent A can be polyoxyethylene (POE) and substituent B can be alkyl. The alkyl described herein includes alkyl, cycloalkyl, functionalized alkyl, functionalized cycloalkyl, alkene, alkylsilane, one or more of which carbon atoms may be substituted with one or more atoms selected from oxygen, nitrogen, sulfur, phosphorous, halogen, silicon, and combinations thereof. Each hydrophobic substituent B include from 1 to 100 carbon atoms and preferably 2 to 25 carbon atom and most preferably 2 to 10 carbon atoms. The addtitives shown in FIG. 1A is polyoxyethylene alkyl ether (PAE).

Figure 1B:
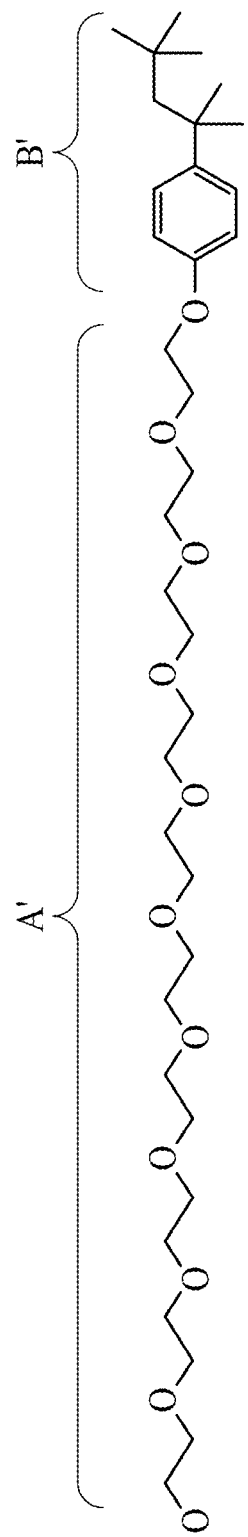
FIG. 1B is a chemical formula for one slurry additive in a CMP slurry, in accordance with some embodiments of the present disclosure.

Referring to FIG. 1B, in some embodiments, substituent A' includes a hydrophilic end and substituent B' includes a hydrophobic end. Both ends are away from the oxygen. For example, substituent A' can be polyoxyethylene (POE) and substituent B' can be aromatic and functionalized aromatic such as alkylphenyl, as shown in substituent B' of FIG. 1B. Each hydrophobic substituent B' include from 1 to 100 carbon atoms and preferably 2 to 25 carbon atom and most preferably 2 to 10 carbon atoms. The addtitives shown in FIG. 1B is polyoxyethylene alkylphenyl ether.

Figure 2:
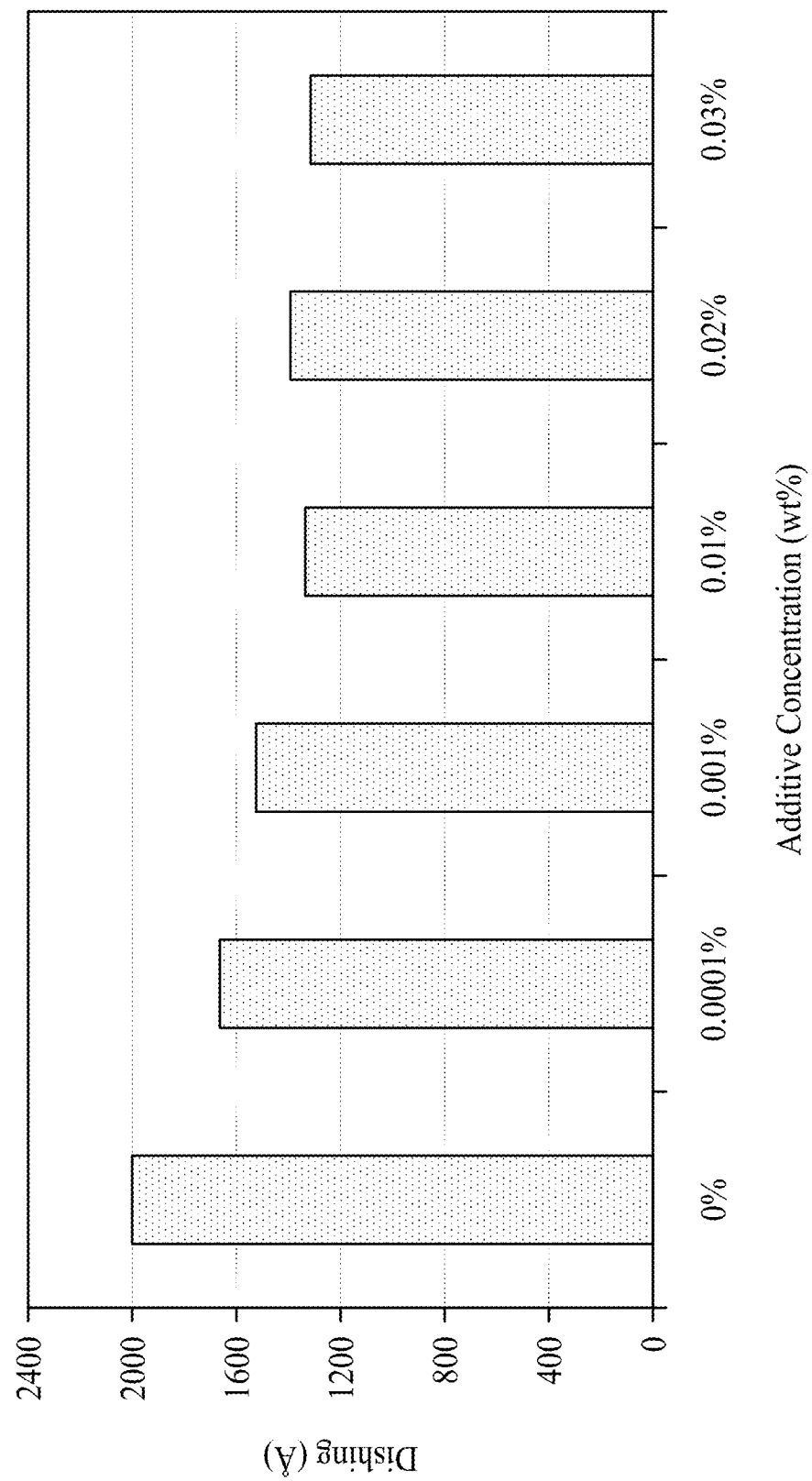
FIG. 2 shows measurement result of post-CMP dishing with the addition of the additives described herein in a CMP slurry, in accordance with some embodiments of the present disclosure.
Figure 3:
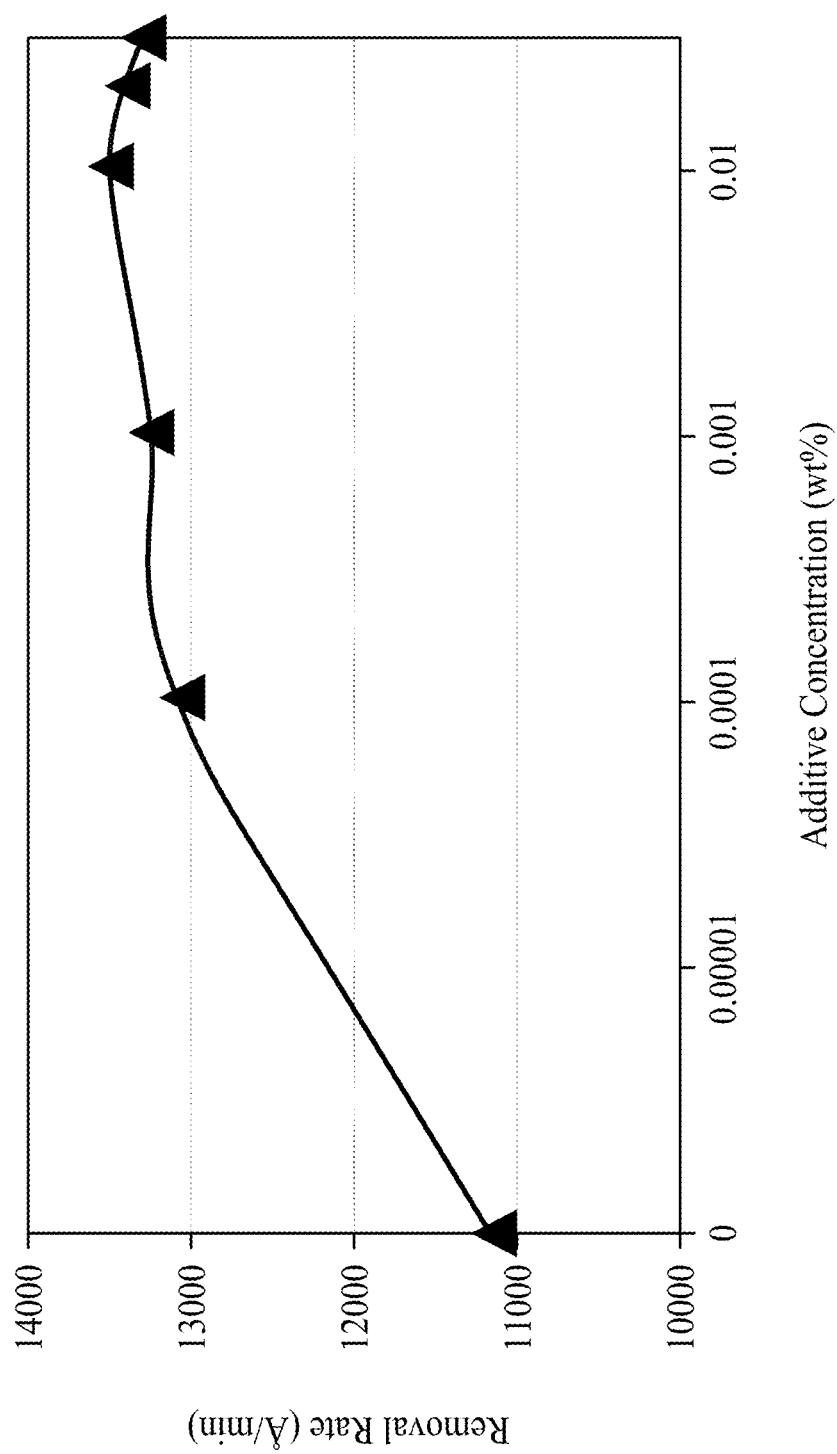
FIG. 3 shows measurement result of removal rate of metal CMP with the addition of the additives described herein in a CMP slurry, in accordance with some embodiments of the present disclosure.

Referring to FIG. 2, FIG. 2 shows measurement result of post-MP dishing with the addition of the additives described herein in CMP slurry, in accordance with some embodiments of the present disclosure. When no additives herein described are added into the CMP slurry, a 2008 Å dishing is measured. The dishing reduced with the increase amount of the additives introduced. For example, a 1345 Å dishing can be obtained when the additive is added by 0.01 wt %. A 33% decrease of the dishing figure can be achieved by adding the additives described herein by 0.01 wt %. Lower weight percent of the additives described herein also shows dishing reduction effect. For example, when adding the additives described herein by 0.0001 wt %, the dising starts to decrease from 2008 Å to 1667 Å. When adding the additives described herein by 0.001 wt %, the dising further decreases from 2008 Å to 1526 Å. Further increase from 0.01 wt % of the additives in the overall CMP slurry does riot seriously affect the dishing figure, and thus the additives described herein is suitable to add into the CMP slurry by at least 0.0001 wt %, for example, in a range from about 0.0001 wt % to about 0.03 wt %, Referring to FIG. 3, FIG. 3 shows measurement result of removal rate of metal CMP with the addition of the additives described herein in a CMP slurry, in accordance with some embodiments of the present disclosure. When no additives herein described are added into the CMP slurry, a 11000 Å/min removal rate is measured. The removal rate increases with the increase amount of the additives introduced. For example, a 13100 Å/min removal rate can be obtained when the additive is added by 0.0001 wt %. Alternatively stated, a 19% increase of the removal rate can be achieved by adding the additives described herein only by 0.0001 wt %. For another example, a 13400 Å/min removal rate can be obtained when the additive is added by 0.01 wt %. A 20% increase of the removal rate can be achieved by adding the additives described herein by 0.01 wt %. Further increase of the additives in the overall CMP slurry does not seriously affect the removal rate, and thus the additives described herein is suitable to add into the CMP slurry by at least 0.0001 wt %, for example, in a range from about 0.0001 wt % to about 0.03 wt %.

Conventional surfactant, such as 1,2,4-Triazole, used for dishing reduction acts as polishing inhibitor which attached to the surface to be polished and forming an inhibiting buffer layer, preventing mechanical polisher (e.g., abrasives) and chemical polisher (e.g., chelator or oxidizing agent) from interacting with the surface. When approaching to the end of the polishing session, diluted ionized (DI) water is added to the slurry and thus the concentration of the conventional inhibitor such as 1,2,4-Triazole is decreased. The dilution of the inhibitor weakens the inhibiting buffer layer, allowing more interaction between the mechanical polisher, chemical polisher and the surface to be polished. Henceforth, the removal rate at the end of polishing session was empirically measured to be increased. However, the increase of the removal rate is not desired at the end polishing session because noticeable metal pitting can be observed due to the surge of the removal rate.

The surface modificator or the surfactant described herein not only serves as a polishing inhibitor to abrasives but also serves as an accelerator to chelators and oxidizing agents in the CMP slurry. Please refer to FIG. 6 and FIG. 7 for the mechanism of the surfactant described herein. Employing the surfactant described herein in the CMP slurry does not increase, but rather decrease, the removal rate under diluted condition. When approaching the end of the polishing session, adding DI water into the CMP slurry does not lead to the surge of removal rate. In contrast, the removal rate decreases when the concentration of the surfactant described herein decreases. It is more desirable to obtain slower removal rate at the end of the polishing session when the intended polishing target is achieved.

Figure 4:
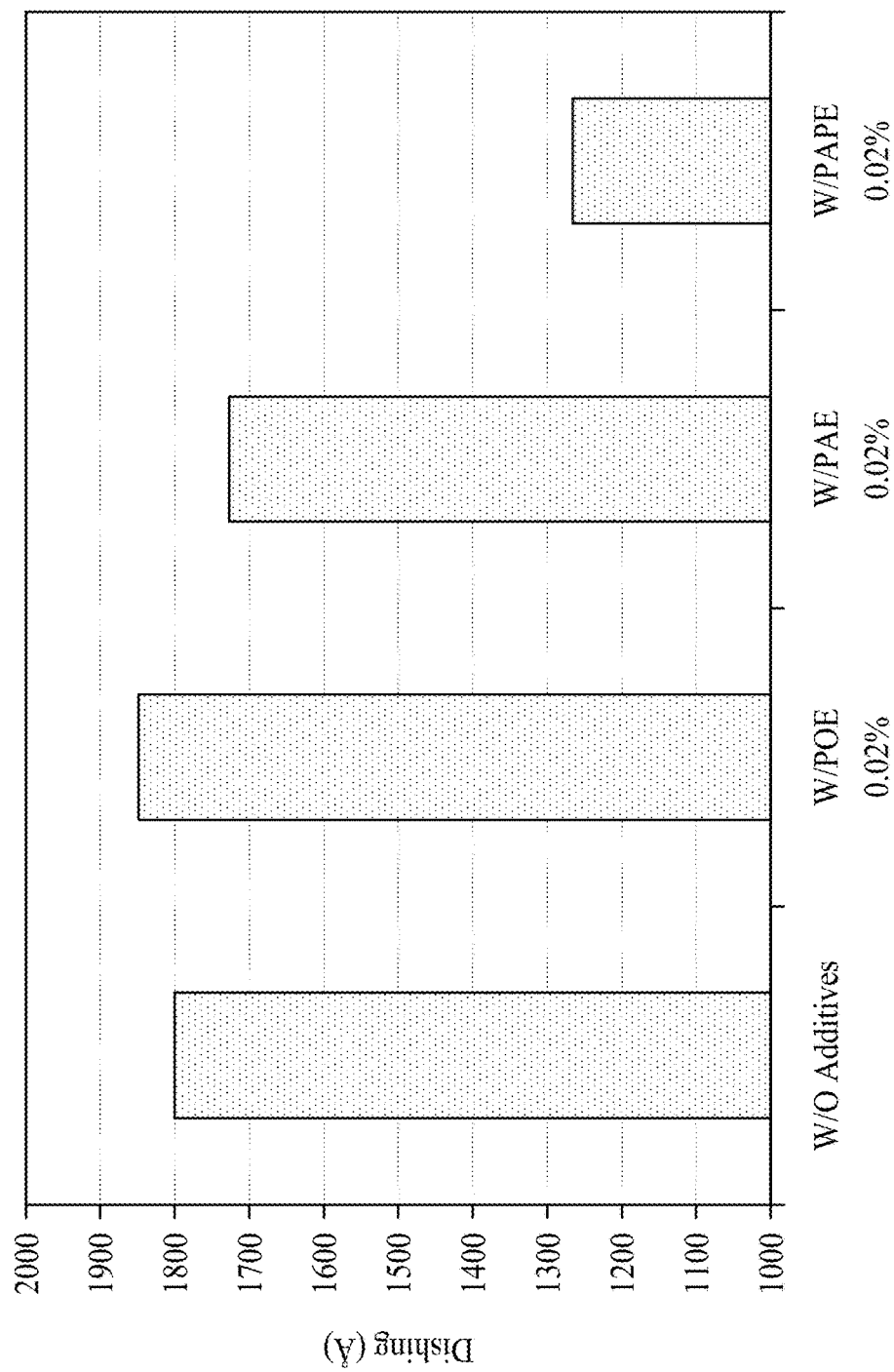
FIG. 4 shows measurement result of measurement result of post-CMP dishing with and without the addition of the additives described herein in a CMP slurry, in accordance with some embodiments of the present disclosure.

Referring to FIG. 4, FIG. 4 shows measurement result of post-CMP dishing with and without the addition of the additives described herein in CMP slurry, in accordance with some embodiments of the present disclosure. In FIG. 4, when no additives are added into the CMP slurry, a 1800 Å dishing is measured. Adding additives not included in the present disclosure, for example, additives without a hydrophobic end and an opposite hydrophilic end, may exacerbate the CMP dishing. For example, by adding 0.02 wt % of polyoxyethylene (POE), an even greater 1850 Å dishing is obtained. However, the dishing reduces with the increase amount of the additives included in the present disclosure. For example, a 1710 Å dishing can be obtained when the polyoxyethylene alkyl ether (PAE) is added by 0.02 wt %. For another example, a 1260 dishing can be obtained when the polyoxyethylene alkylphenyl ether (PAPE) is added by 0.02 wt %. Given that all other components, such as the abrasive, oxidizing agent, complexing agent, of the CMP slurry are identical, adding the additives described in the present disclosure effectively reduces the dishing figures.

Figure 5A:
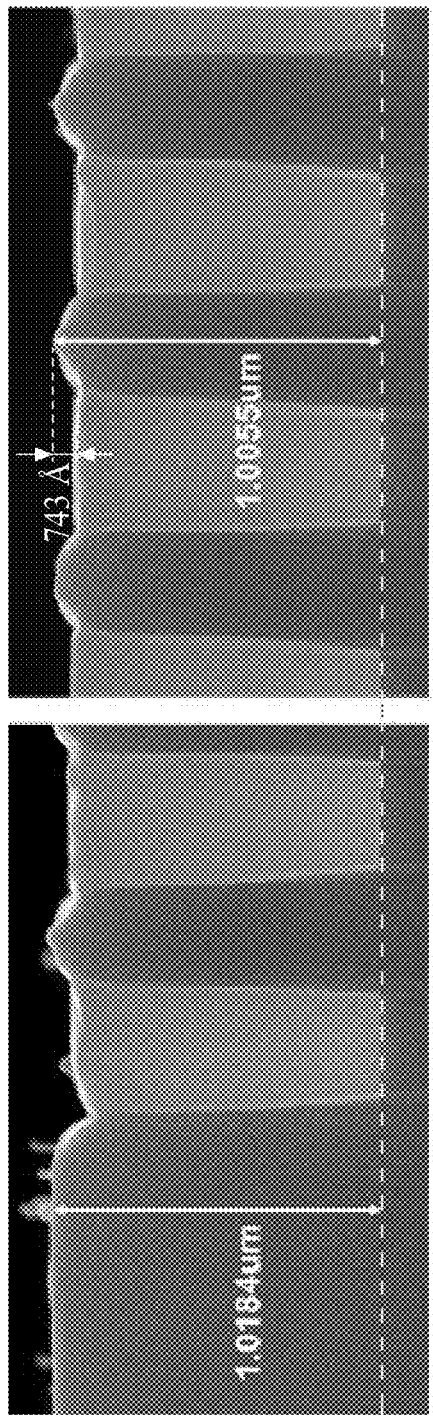
FIG. 5A and FIG. 5B show the reduction of degrees of dishing and the reduction of degrees of erosion with the addition of the additives described herein in a CMP slurry, in accordance with some embodiments of the present disclosure.
Figure 5B:
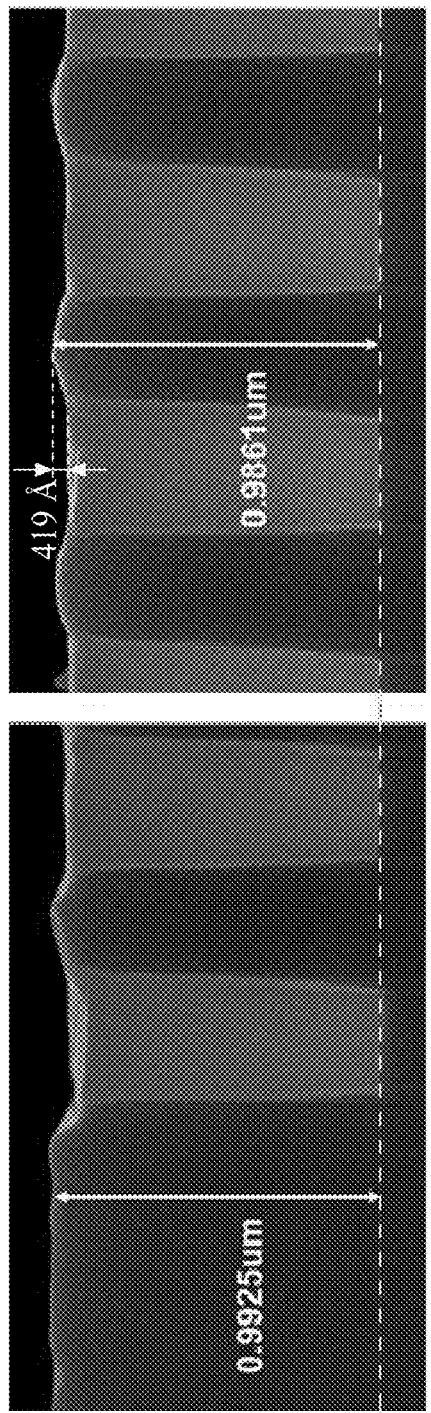

Referring to FIG. 5A and FIG. 5B, FIG. 5A and FIG. 5B show the reduction of degrees of dishing and the reduction of degrees of erosion with the addition of the additives described herein in a CMP slurry, in accordance with some embodiments of the present disclosure. In FIG. 5A, no additives described herein are added to the CMP slurry, and the dishing measured from the SEM picture of FIG. 5A is about 743 Å. In FIG. 5B, 0.01 wt % of polyoxyethylene alkylphenyl ether (PAPE) is added to the CMP slurry, and the dishing measured from the SEM picture of FIG. 5B is about 419 Å. A 43% reduction of dishing can be obtained by merely adding the aforesaid amount of additives i.e., PAPE).

On the other hand, in FIG. 5A, when no additives described herein are added to the CMP slurry, the erosion measured from the SEM picture of 5A is about 129 Å (note: difference between 10184 Å and 10055 Å). However, as shown in FIG. 5B, when 0.01 wt % of polyoxyethylene alkylphenyl ether (PAPE) is added to the CMP slurry, the erosion measured from the SEM picture of FIG. 5B is about 64 Å. A 50% reduction of erosion can be obtained by merely adding the aforesaid amount of additives (i.e., PAPE). The addition of the additives described herein, especially the one with surfactant or surface modificator effect, can effectively reduce dishing and erosion in a CMP operation.

Figure 6:
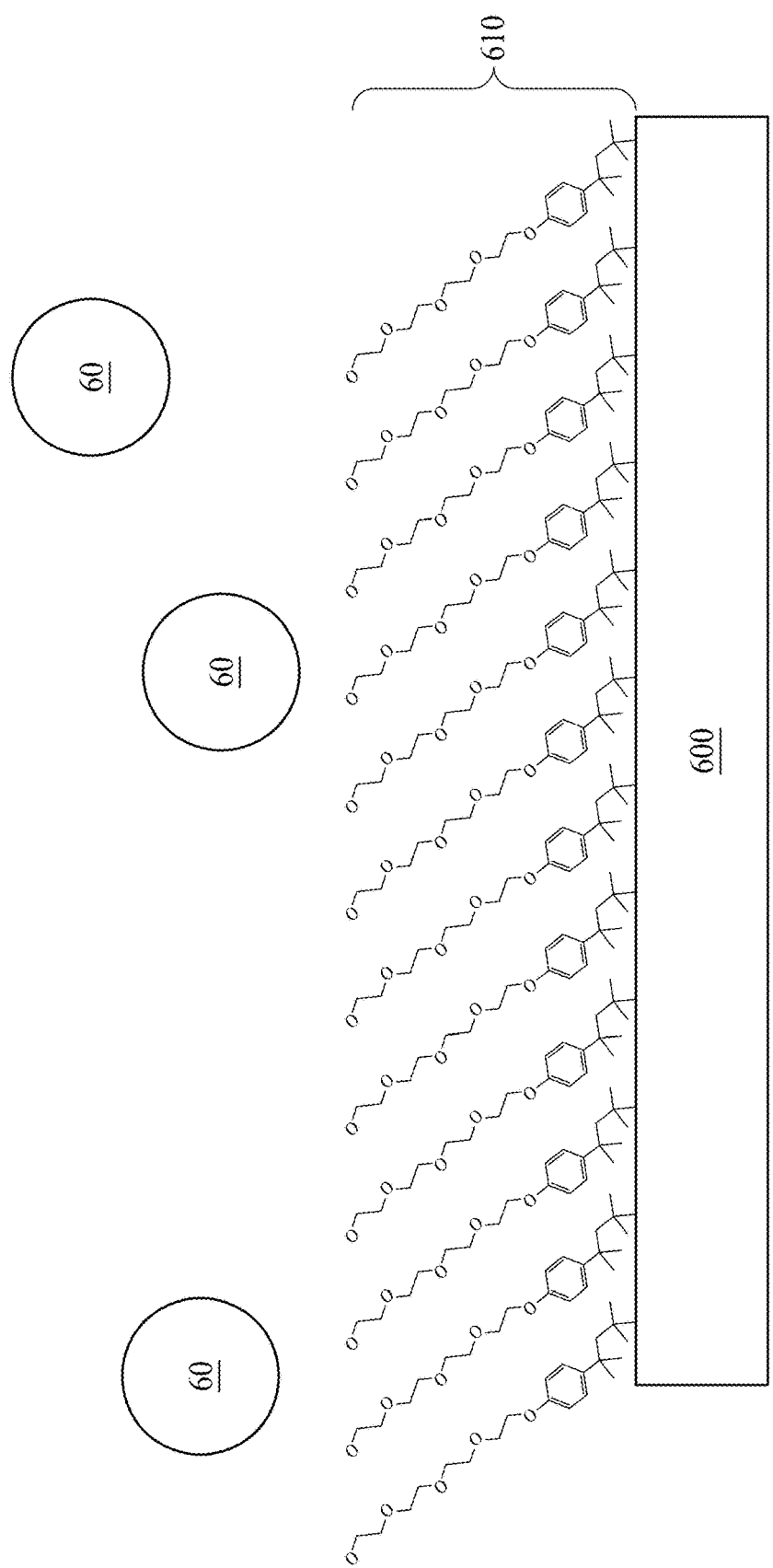
FIG. 6 illustrates mechanical force mechanism of the addition of the additives described herein in a CMP slurry, in accordance with some embodiments of the present disclosure.

Referring to FIG. 6, FIG. 6 illustrates mechanical force mechanism of the addition of the additives described herein in CMP slurry, in accordance with some embodiments of the present disclosure. In FIG. 6, a mechanical aspect of the CMP process in shown. Abrasives 60, such as silica spheres are repulsed by the buffer layer 610 formed by the hydrophilic ends of the additives described herein. On the other hand, the hydrophobic ends of the additives are in contact with the surface to be polished 600, for example, a copper or copper-containing alloy surface. The presence of the additives described herein serves as a surfactant modifying a hydrophobic surface, i.e., the metal surface or the surface to be polished 600, into a hydrophilic surface. Alternatively stated, the buffer layer 610 composed of the hydrophobic-hydrophilic additives attaches at the surface to be polished 600 at one end, and repulsing the abrasive silica spheres at the other end. The mechanical impact exerted from the abrasive to the surface to be polished 600 is thus restrained by the introduction of the additives. In this connection, the hydrophobic-hydrophilic additives retard mechanical polishing effect of the CMP, in order to reduce the degree of surface defects such as dishing and erosion.

Figure 7:
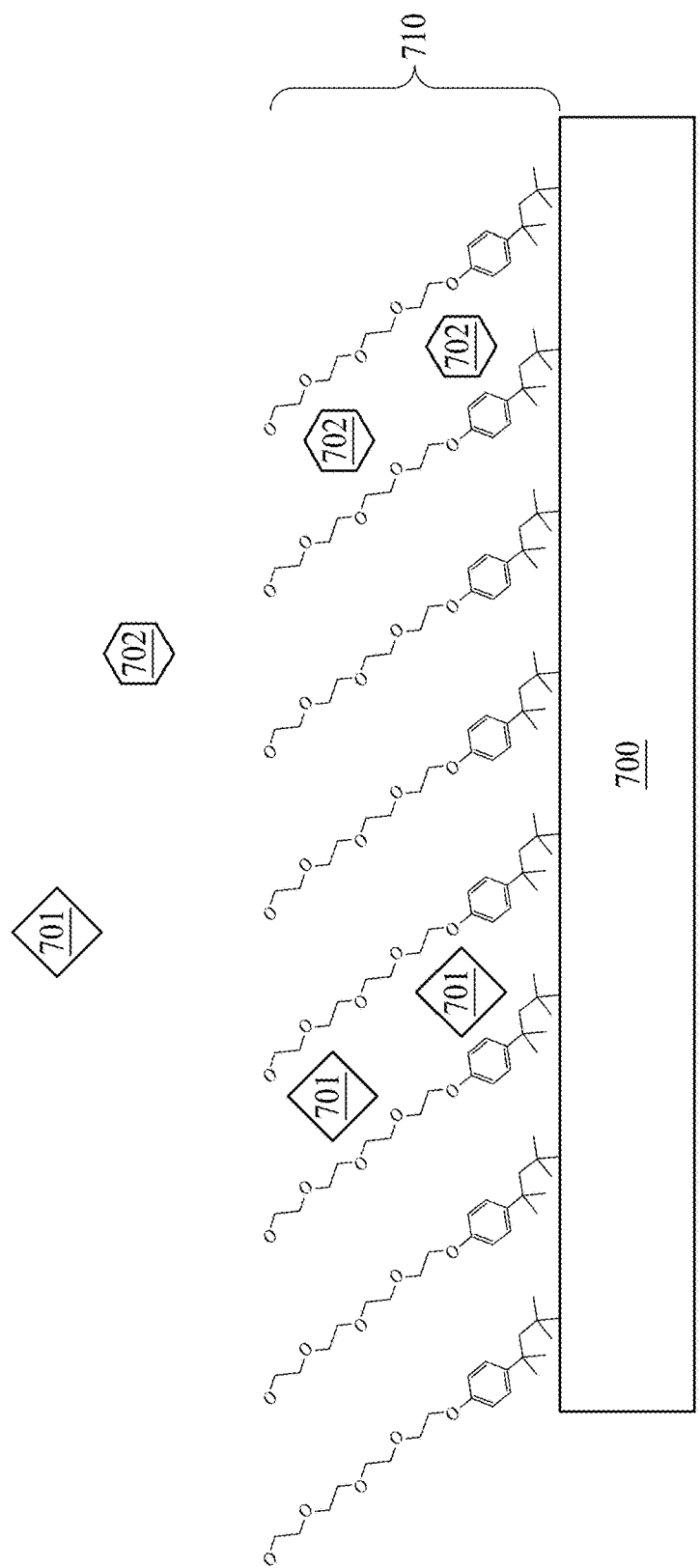
FIG. 7 illustrates chemical force mechanism of the addition of the additives described herein in CMP slurry, in accordance with some embodiments of the present disclosure.

Referring to FIG. 7, FIG. 7 illustrates chemical force mechanism of the addition of the additives described herein in CMP slurry, in accordance with some embodiments of the present disclosure. In FIG. 7, a chemical aspect of the CMP process in shown. Oxidizing agents 701 and chelators 702 are attracted by the buffer layer 710 formed by the hydrophilic ends of the additives described herein. On the other hand, the hydrophobic ends of the additives are in contact with the surface to be polished 700, for example, a copper or copper-containing alloy surface. The presence of the additives described herein serves as a surfactant modifying a hydrophobic surface, i.e., the metal surface or the surface to be polished 700, into a hydrophilic surface. Alternatively stated, the buffer layer 710 composed of the hydrophobic-hydrophilic additives attaches at the surface to be polished 600 at one end, and attracting the oxidizing agents 701 and chelators 702 at the other end. The chemical impact exerted from the oxidizing agents 701 and chelators 702 to the surface to be polished 700 is thus enhanced by the introduction of the additives. In other words, the wettability of the surface to be polished 700 with respect to the chemicals (e.g., oxidizing agents 701 and chelators 702) is improved. In this connection, the hydrophobic-hydrophilic additives enhance the milder chemical polishing effect of the CMP, obtaining better post-CMP surface morphology and adequate removal rate.

The present disclosure provides a method for reducing CMP defects such as dishing and erosion. The method includes adding an additive into CMP slurry by at least 0.0001 wt %. Moreover, the additive modifies a surface to be polished from hydrophobic to hydrophilic. The polishing compositions of this invention are used to polish substrate features by conventional means using conventional polishing machines. The polishing compositions of this invention may be applied directly to the substrate, they may be applied to a polishing pad, or they may be applied to both in a controlled manner during substrate polishing. It is preferred however that polishing compositions are applied to a polishing pad which thereafter is brought into contact with the substrate surface after which the pad is moved in relationship to the substrate surface in order to achieve substrate polishing. Polishing compositions of this invention are then continuously or intermittently applied to the polishing pad in order to maintain a sufficient amount of polishing composition at the pad/substrate surface. When the polishing end point is reached, the flow of polishing composition to the polishing pad is interrupted and excess polishing composition is washed from the substrate with deionized water or another solvent.

Some embodiments of the present disclosure provide a chemical mechanical polishing (CMP) composition, including a surfactant having one hydrophobic end and one hydrophilic end opposite to the hydrophobic end.

Some embodiments of the present disclosure provide chemical mechanical polishing (CMP) slurry, including an abrasive, a chelator, an oxidizing agent, and a surface modificator, The surface modificator is configured to modify a surface from hydrophobic to hydrophilic.

Some embodiments of the present disclosure provide a method for reducing chemical mechanical polishing (CMP) surface defects. The method includes adding an additive into CMP slurry by at least 0.0001 wt %, wherein the additive modifies a surface to be polished from hydrophobic to hydrophilic.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A chemical mechanical polishing (CMP) composition, comprising:
   a surfactant having one hydrophobic end and one hydrophilic end opposite to the hydrophobic end, wherein the surfactant comprises polyoxyethylene alkylphenyl ether (PAPE), and the surfactant occupies more than 0.01 wt % of the CMP composition.

2. The CMP composition of claim 1, wherein the surfactant is configured to modify a surface from hydrophobic to hydrophilic.

3. The CMP composition of claim 1, further comprising:
   an abrasive;
   a chelator; and
   an oxidizing agent.

4. The CMP composition of claim 3, wherein the abrasives comprise metal oxides.

5. The CMP composition of claim 3, wherein the abrasives comprise fumed abrasives or precipitated abrasives.

6. The CMP composition of claim 3, wherein the surfactant occupies 0.02 wt % of the CMP composition.

7. A chemical mechanical polishing (CMP) slurry, comprising:
   an abrasive;
   a chelator;
   an oxidizing agent; and
   a surface modificator, configured to modify a surface from hydrophobic to hydrophilic, wherein the surface modificator comprises polyoxyethylene alkylphenyl ether (PAPE), and the surface modificator occupies 0.01 wt % of the CMP slurry.

8. The CMP slurry of claim 7, wherein the abrasives comprise metal oxides.

9. The CMP slurry of claim 7, wherein the abrasives comprise fumed abrasives or precipitated abrasives.

10. The CMP slurry of claim 7, wherein the surface modificator is configured to modify a surface from hydrophobic to hydrophilic.

11. The CMP slurry of claim 7, wherein the CMP slurry with the surface modificator reduces dishing by 43% and erosion by 50% compared to CMP slurry without the surface modificator.

12. The CMP slurry of claim 7, wherein the CMP slurry with the surface modificator increases removal rate by 20% compared to CMP slurry without the surface modificator.

13. A chemical mechanical polishing (CMP) slurry, comprising:
   an abrasive;
   a chelator;
   an oxidizing agent; and
   a compound having a first substituent having a hydrophilic end and a second substituent having a hydrophobic end, the first substituent is connected with the second substituent by an oxygen, wherein the compound comprises polyoxyethylene alkylphenyl ether (PAPE), and the compound occupies 0.01 wt % of the CMP slurry.

14. The CMP slurry of claim 13, wherein the abrasives comprise metal oxides.

15. The CMP slurry of claim 13, wherein the abrasives comprise fumed abrasives or precipitated abrasives.

16. The CMP slurry of claim 13, wherein the abrasives comprise metal oxides.

17. The CMP slurry of claim 13, wherein the abrasives comprise fumed abrasives or precipitated abrasives.

18. The CMP slurry of claim 13, wherein the compound is configured to modify a surface from hydrophobic to hydrophilic.

19. The CMP slurry of claim 13, wherein the CMP slurry with the compound reduces dishing by 43% and erosion by 50% compared to CMP slurry without the compound.

20. The CMP slurry of claim 13, wherein the CMP slurry with the compound increases removal rate by 20% compared to CMP slurry without the compound.

* * * * *